United States Patent [19]

Fukushima

[11] 4,287,569
[45] Sep. 1, 1981

[54] SEMICONDUCTOR MEMORY DEVICE

[75] Inventor: Toshitaka Fukushima, Yokohama, Japan

[73] Assignee: Fujitsu Limited, Japan

[21] Appl. No.: 73,486

[22] Filed: Sep. 7, 1979

[30] Foreign Application Priority Data

Sep. 8, 1978 [JP] Japan ................................. 53-110503

[51] Int. Cl.³ ..................... G11C 11/36; G11C 17/06
[52] U.S. Cl. ..................................... 365/96; 365/105; 365/175; 307/238.1
[58] Field of Search ................... 365/96, 94, 103, 104, 365/105, 175; 307/238

[56] References Cited

U.S. PATENT DOCUMENTS

| | | | |
|---|---|---|---|
| 3,529,299 | 9/1970 | Chung | 365/96 |
| 3,611,319 | 10/1971 | Hyatt | 365/96 |
| 3,742,592 | 7/1973 | Rizzi et al. | 365/174 |
| 4,064,493 | 12/1977 | Daves | 365/96 |
| 4,112,505 | 9/1978 | Duval et al. | 365/96 |
| 4,131,909 | 12/1978 | Matsuda | 357/23 |

Primary Examiner—Terrell W. Fears
Attorney, Agent, or Firm—Staas & Halsey

[57] ABSTRACT

In a semiconductor memory device having a plurality of memory cells located at a cross position of a plurality of bit lines and a plurality of word lines, the memory cell comprising a series circuit of an information storing element such as a diode or a fuse and a PNP type transistor. An N type epitaxial layer is used as a word line and the P type semiconductor substrate is used as a collector output line.

10 Claims, 18 Drawing Figures

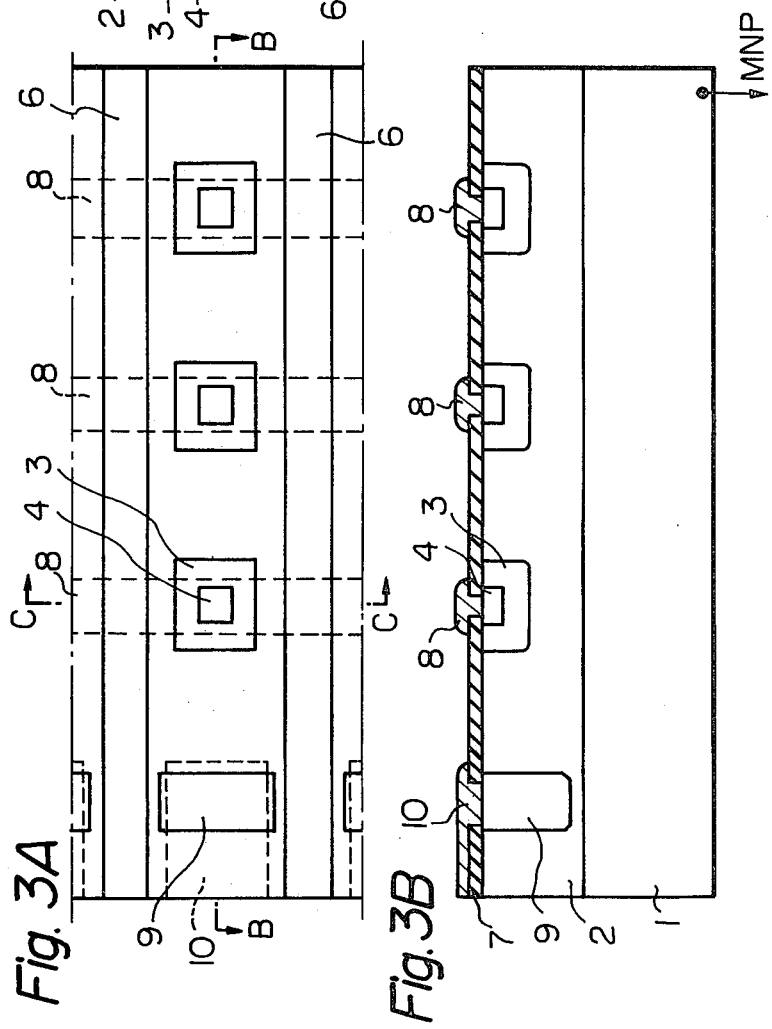

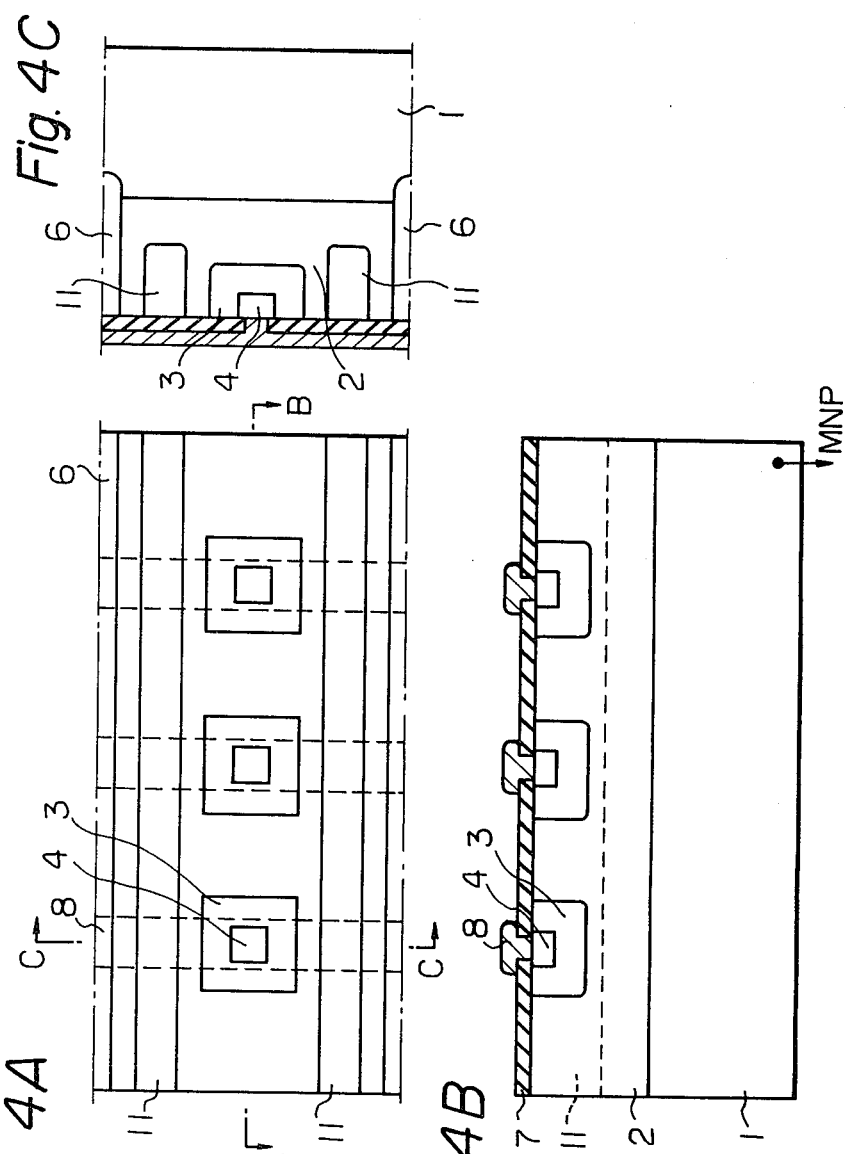

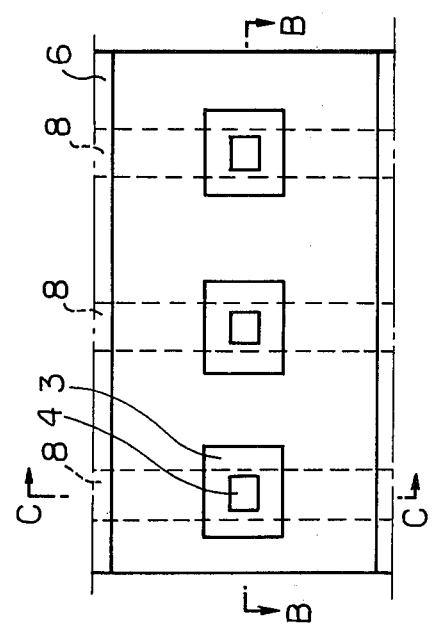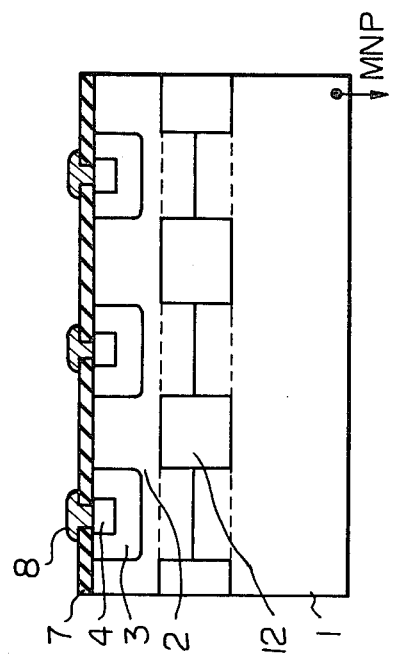

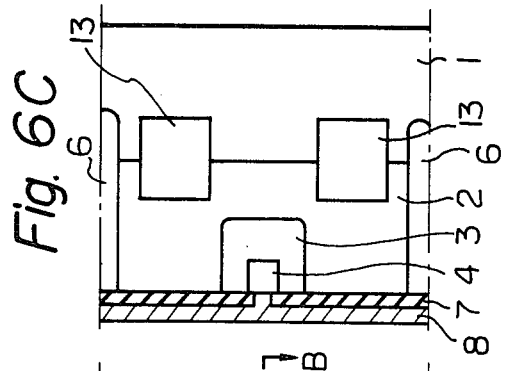
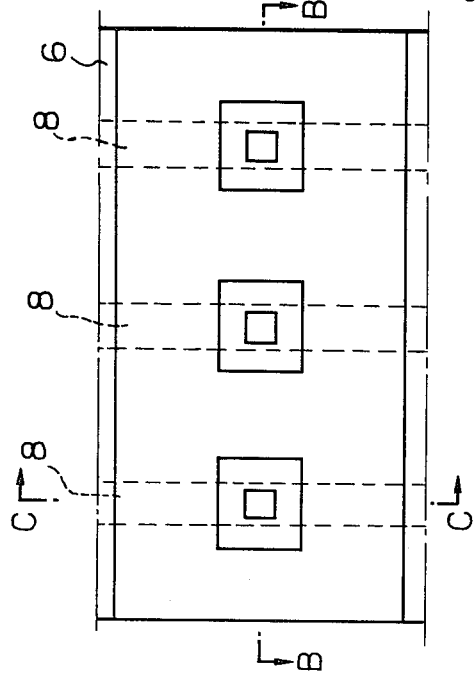
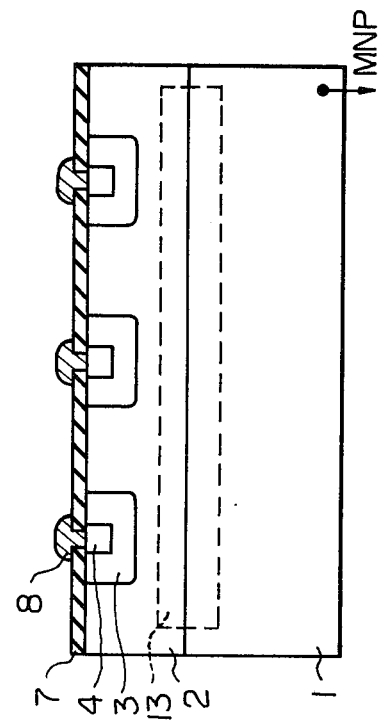

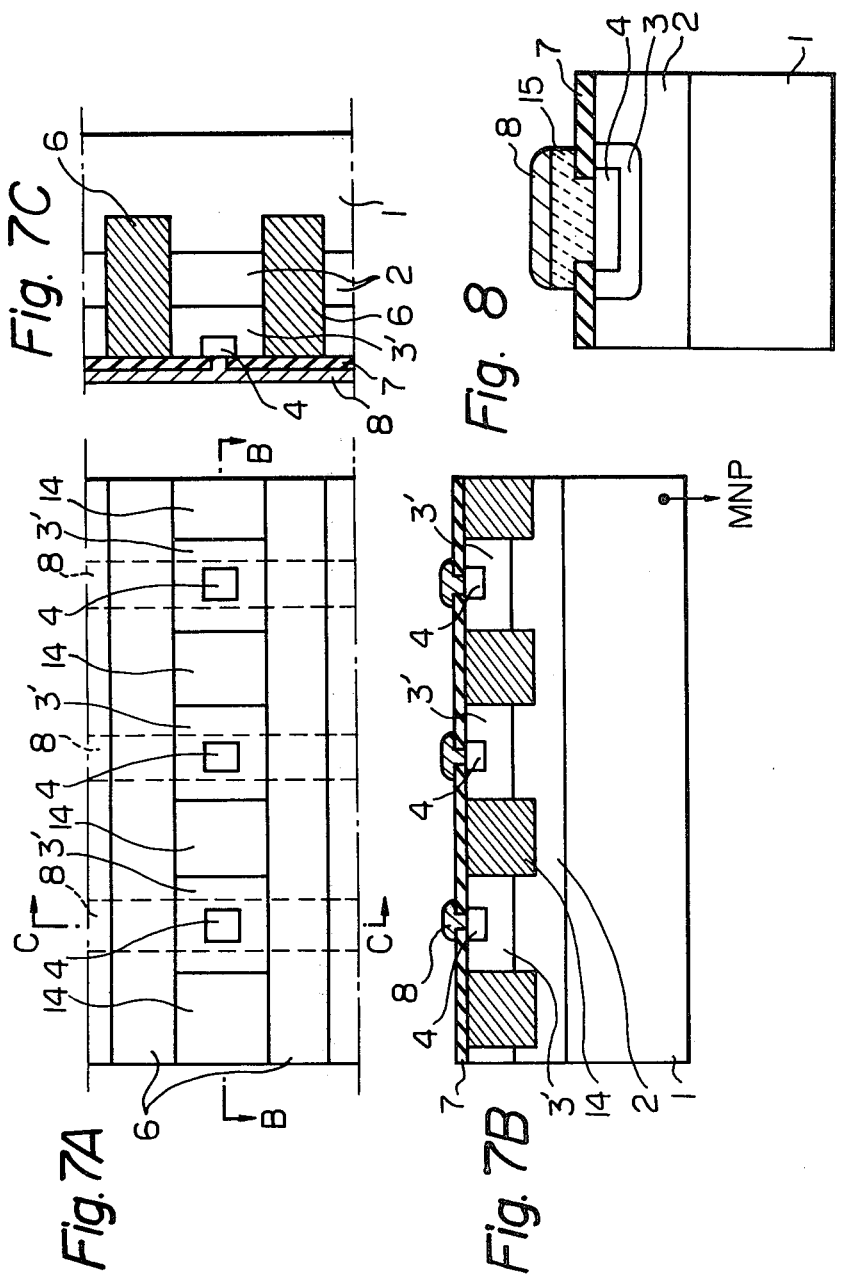

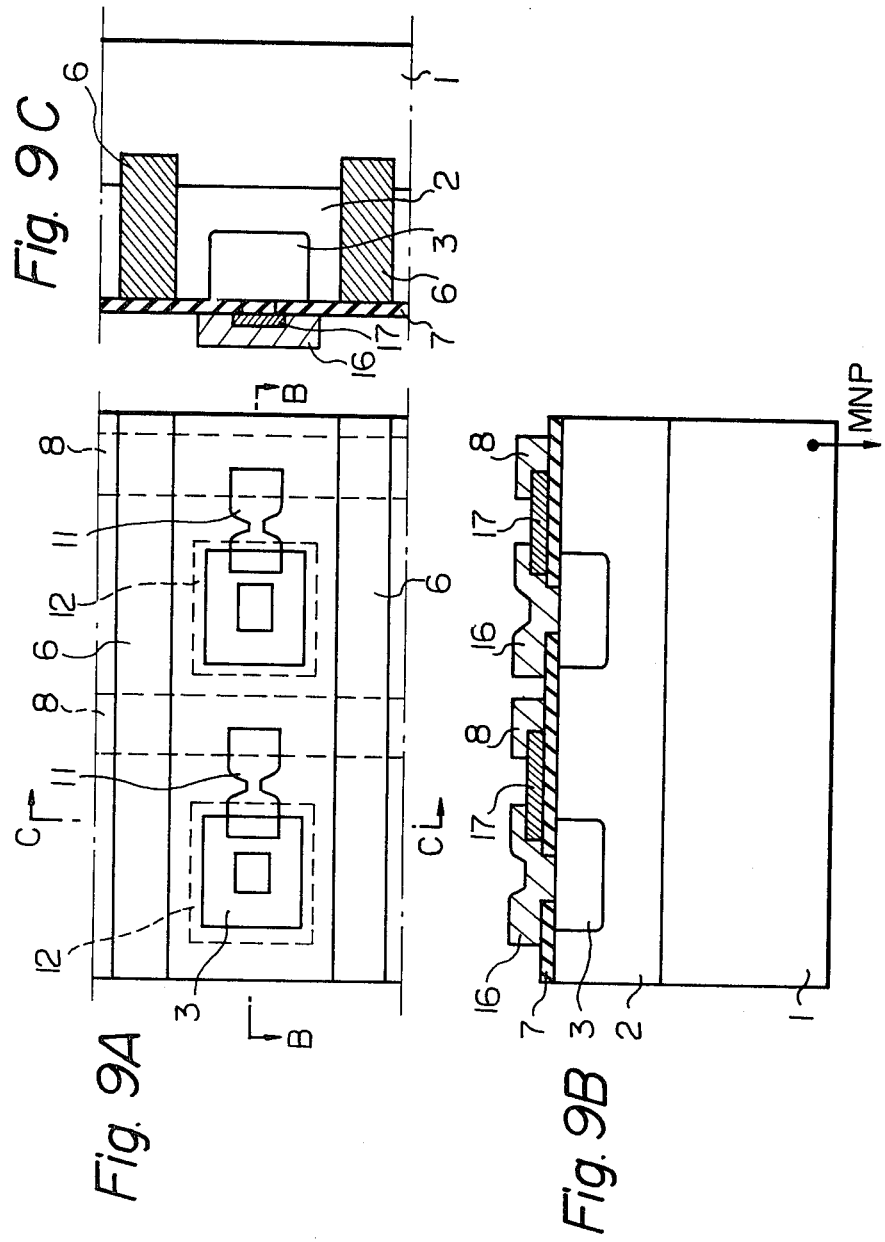

SEMICONDUCTOR MEMORY DEVICE

BACKGROUND OF THE INVENTION (1). Field of the Invention

The present invention relates to a semiconductor memory device, more particularly to a programmable read only memory device used in an electronic device, such as an electronic computer.

(2). Prior Art

In general, a programmable read only memory (P-ROM) device which is one of the semiconductor memory devices, consists of a matrix, which is formed by a cross structure of a plurality of bit lines and a plurality of word lines, and a memory cell at each cross position of the matrix. The memory cell consists of either a series circuit of two diodes of opposite polarity or a series circuit of a fuse and a diode connected between the bit line and the word line. The writing-in of information to this memory device is effected by either bringing one of the two diodes to a short-circuit status or by fusing the fuse, due to the supply of a writing-in current, to the selected bit and word lines connecting circuit. The value of this writing-in current is, for example, about 100 mA to 200 mA, which is more than a hundred times greater than the reading-out current, the value of which is about 0.5 mA.

In the prior art, a decoder driver circuit is connected at the end of the above mentioned word line to which the memory cells are connected. The writing-in current flows into this decoder driver circuit. In this prior art circuit structure, a current sink capacity, which enables the absorption of a large writing-in current, is required for this decoder driver circuit. To meet this requirement, this decoder driver circuit comprises a great number of large transistors and like elements and includes a great number of related connecting conductors so that the decoder driver circuit is big in size and complicated in structure. If such a big and complicated decoder driver circuit is used, the occupying area of the circuit pattern in the semiconductor device which forms the memory device is increased, the parasitic capacitance in the memory is increased and thus the operation time is lengthened. Accordingly a problem in the prior art memory device is that, it is difficult to increase the reading-out speed of the memory. Another problem in the prior art memory is that it is difficult to increase the degree of integration (information storing capacity) of memory cells in a semiconductor device having a predetermined reading-out speed, because the decoder driver circuit occupies its own space.

With regard to the above described prior art memory, an example of the read only memory devices of the combined diode type is disclosed in U.S. Pat. No. 3,742,592, an example of the read only memory devices of the fuse type is disclosed in U.S. Pat. No. 3,147,461 and an introductory explanation regarding bipolar RAM and ROM is found in the Proceedings of the Institute of Electronics and Communication Engineers of Japan Vol. 60, No. 11, Nov. 1957, pages 1252 through 1257.

Another prior art P-ROM type semiconductor memory device is disclosed in Laid-open Japanese Patent Application No. 52-71183 (priority date: Dec. 5, 1975, France, No. 7537358) in which the memory cell consists of a lateral PNP type transistor and a PN junction diode or a fuse. This lateral PNP type transistor consists of an N type epitaxial layer, which forms a word line, formed on a P type semiconductor substrate and with P type regions formed separately in the N type epitaxial regions. In this memory device, the writing-in of the information is effected by passing a writing-in current from a selected bit line through the PN junction diode or fuse connected to the bit line, the lateral PNP type transistor and a shunt which is parallel with the bit line. Accordingly, the writing-in current to a memory cell located remote from the shunt passes through a lateral PNP type transistor which is loated between the memory cell and the shunt and is formed by a P type region forming other memory cells, in case where the writing-in current passes between a bit line connected to the memory cell and the shunt.

Accordingly, in this prior art memory device, the energy for writing-in the information into the selected memory cell connected to a bit line varies in accordance with the position of the selected bit line during writing-in of the information. Therefore, it is necessary to determine the ability of the writing-in circuit so that the writing-in into the memory cell connected to the bit line located at the remotest position is possible. However, this causes a reduction in the degree of integration for a semiconductor memory device of greater capacity. In addition, the shunt reduces the degree of integration for a semiconductor memory device.

SUMMARY OF THE INVENTION

In order to solve the afore memtioned problems, the present invention employs a PNP type transistor in the memory cell of a memory device.

It is a principal object of the present invention to cause the writing-in current to flow through the collector of the PNP type transistor, and to reduce to portion of the writing-in current which flows in the decoder driver, and eliminate the necessity of increasing the current sink capacity of the decoder driver, and thus make transistors and the like elements in the decoder driver small. This in turn reduces the number of transistors, the like elements and the connecting conductors, and accordingly increasing the reading-out speed of the memory device and increases the degree of integration (information storing capacity) of the memory cells in the semiconductor device having a predetermined reading-out speed.

It is another object of the present invention to provide an advantageous structure for including the PNP type transistor in the memory cell of the memory device.

BRIEF DESCRIPTION OF THE DRAWINGS

FIGS. 3A, 3B and 3C illustrate a structure of the memory device shown in FIG. 1A. FIGS. 3A, 3B and 3C are the plan view, the longitudinal cross-sectional view taken on line B-B of FIG. 3A and the lateral cross-sectional view taken on line C-C of FIG. 3A, respectively.

FIGS. 4A, 4B, 4C, 5A, 5B, 5C, 6A, 6B, 6C, 7A, 7B and 7C illustrate four modifications of the memory device shown in FIGS. 3A, 3B and 3C. FIGS. 4A, 5A, 6A and 7A are the plan view, FIGS. 4B, 5B, 6B and 7B are the longitudinal cross-sectional view taken on lines B-B of FIGS. 4A, 5A, 6A and 7A, respectively, and FIGS. 4C, 5C, 6C and 7C are the lateral cross-sectional view taken on lines C-C of FIGS. 4A, 5A, 6A and 7A, respectively.

FIG. 8 illustrates a further modification of the memory device shown in FIGS. 3A, 3B and 3C.

FIGS. 9A, 9B and 9C illustrate a structure of the memory device shown in FIG. 2. FIGS. 9A, 9B and 9C are the plan view, the longitudinal cross-sectional view taken on line B-B of FIG. 9A and the lateral cross-sectional view taken on line C-C of FIG. 9A, respectively.

DETAILED DESCRIPTION OF THE PREFERRED EMBODIMENTS

Figure 1A:
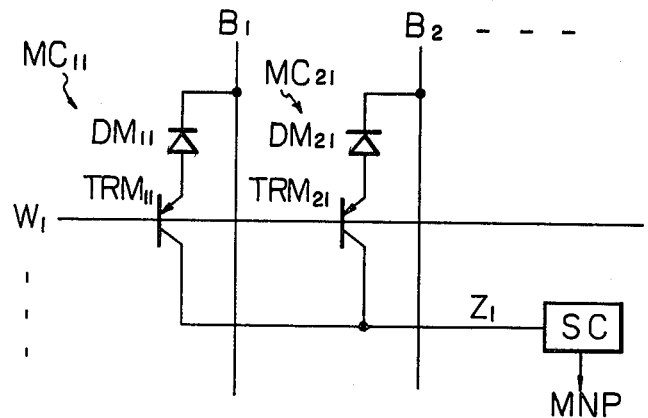
FIGS. 1A and 1B illustrate circuit diagrams of a memory device, according to a first embodiment of the present invention, having a memory cell including a diode.

The circuit diagram of a memory device, in accordance with a first embodiment of the present invention, having a memory cell including a diode is illustrated in FIG. 1A. A plurality of bit lines $B_1$, $B_2$, ... and plurality of word lines, one being $W_1$, ... are crossed to form a matrix. At each cross position of the matrix, the memory cells $MC_{11}$, $MC_{21}$, ... are connected between a bit line and a word line. The memory cell $MC_{11}$ ($MC_{21}$) consists of the series of PN junction diode $DM_{11}$ ($DM_{21}$) as the information memorzing element and PNP type transistor $TRM_{11}$ ($TRM_{21}$). The diode $DM_{11}$ ($DM_{21}$) is connected between a bit line $B_1(B_2)$ and the emitter of the PNP type transistor $TRM_{11}$ ($TRM_{21}$). The bases of the PNP type transistors $TRM_{11}$, $TRM_{21}$, ... are connected to the word line $W_1$. The collectors of the PNP type transistors $TRM_{11}$, $TRM_{21}$, ... are connected to a common collector output line $Z_1$. The collector output line $Z_1$ is connected to ground level potential or the most negative potential MNP through the current sink capacity circuit SC as the equivalent circuit formed by a portion of the PNP type transistors $TRM_{11}$, $TRM_{21}$, .... The sink capacity circuit SC consists of a constant current source circuit.

In order to write-in information into, for example, the memory cell $MC_{11}$, the potential of the bit line $B_1$ is made high and the potential of the word line $W_1$ made low. Thus, the transistor $TRM_{11}$ is placed in an ENABLE state and the potential of the emitter of the transistor $TRM_{11}$ is lowered. Accordingly, if the value of the voltage across the diode $DM_{11}$ is larger than the reverse blocking voltage of the diode $DM_{11}$, the PN junction of the diode $DM_{11}$ is broken down (short-circuited). This short-circuiting current for the diode $DM_{11}$ passes from the bit line $B_1$ through the diode $DM_{11}$ to the transistor $TRM_{11}$. The greater portion of the current passes from the emitter to the collector of the transistor $TRM_{11}$ and to the collector output line $Z_1$. The remaining portion of the current, which passes to the word line $W_1$, is $1/\beta$ of the collector current where $\beta$ is the common-emitter current gain and is less than several milli-amperes. Thus, only a current of several milli-amperes at the maximum passes through the word line $W_1$ even while writing-in, the current being similar to the value of the reading-out current. Accordingly, the greater portion of the current sink capacity for the information writing-in to the memory cell is constituted by the collector of the transistor $TRM_{11}$.

Figure 1B:
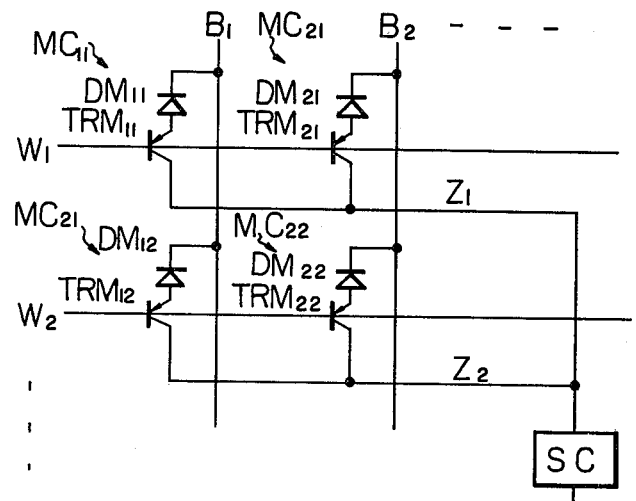

In the circuit illustrated in FIG. 1B, which is a modification of the circuit shown in FIG. 1A, the collector output lines $Z_1$ and $Z_2$, which are connected to the transistors $TRM_{11}$, $TRM_{21}$, ... and the transistors $TRM_{12}$, $TRM_{22}$, ..., connected to the word lines $W_1$, $W_2$ are connected together to the current sink capacity circuit SC as an equivalent circuit in the transistors which is connected to the most negative potential MNP. The operation of the circuit of FIG. 1B will be easily understood with reference to the operation of the circuit of FIG. 1A.

Figure 2:
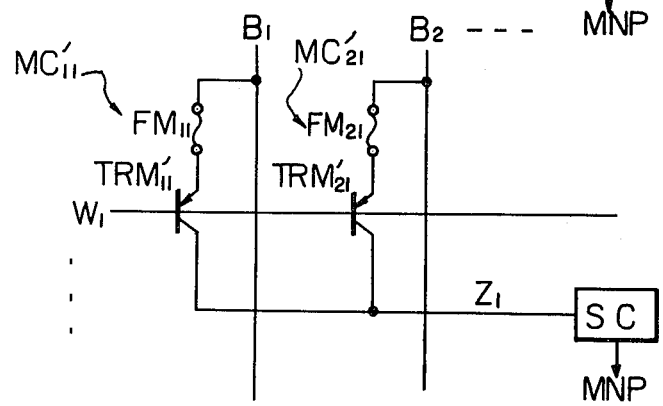
FIG. 2 illustrates a circuit diagram of a memory device, according to a second embodiment of the present invention, having a memory cell including a fuse.

The circuit diagram of the memory, in accordance with another embodiment of the present invention, having the memory cell including the fuse is illustrated in FIG. 2. A plurality of bit lines $B_1$, $B_2$, ... and a plurality of word lines, one being $W_1$ ... are crossed to form a matrix. At each cross position of the matrix, the memory cells $MC_{11}'$, $MC_{21}'$, ... are connected between a bit line and a word line. The memory cell $MC_{11}'$ ($MC_{21}'$) consists of the series of fuse $FM_{11}$ ($FM_{21}$) as the information memorizing element and PNP type transistor $TRM_{11}'$ ($TRM_{21}'$). The fuse $FM_{11}$ ($FM_{21}$) is connected between the bit line $B_1$ ($B_2$) and the emitter of the PNP type transistor $TRM_{11}'$ ($TRM_{21}'$). The bases of the PNP type transistors $TRM_{11}'$, $TRM_{21}'$, ... are connected together to the word line $W_1$. The collectors of the PNP type transistors $TRM_{11}'$, $TRM_{21}'$, ... are connected to a common collector output line $Z_1$. The collector output line $Z_1$ is connected to the most negative potential MNP through the current sink capacity circuit SC as the equivalent circuit formed by a portion of the PNP type transistors $TRM_{11}'$, $TRM_{21}'$, ....

In the circuit of FIG. 2, the writing-in of the information to, for example, the memory cell $MC_{11}'$ is effected in a similar manner as in the memory device of FIG. 1, except that the fusing of the fuse $FM_{11}$ is utilized in the memory device of FIG. 2 instead of the short-circuiting of the diode $DM_{11}$ utilized in the memory device of FIG. 1.

The structure of the integrated circuit in which the memory circuit of FIG. 1A is formed is illustrated in FIG. 3A, 3B and 3C. On the surface of the N type epitaxial layer 2 which is formed on the P type silicon semiconductor substrate 1, a plurality of P type regions 3 are formed separately, an N+ type region 4 being formed in each of the P type regions 3.

The N type epitaxial layer 2 on the P type silicon semiconductor substrate 1 may be formed by means of the well known silicon epitaxial method. The P type region 3 on the surface of the N type epitaxial layer 2 and the N+ type region 4 in the P type region 3 may be formed by means of either the well known impurity diffusion method or the well known ion implantation method. Boron may be used as the impurity for forming the P type region. Phosphorus or arsenic may be used as the impurity for forming the N type region or layer.

The P type silicon semiconductor substrate 1 forms the common collector region of the PNP type transistor $TRM_{11}$, $TRM_{21}$, .... The N type epitaxial layer 2 forms the base region of the PNP type transistor $TRM_{11}$, $TRM_{21}$, ..., the common base region of the adjacent PNP type transistors, and at the same time the word line $W_1$ shown in FIG. 1A. The P type region 3 forms the emitter region of the PNP type transistor $TRM_{11}$, $TRM_{21}$, ... . The PN junction formed by the P type region 3 and the N+ region 4 formed in the P type region 3 forms the diode $DM_{11}$ for storing the information shown in FIG. 1A. The isolation region 6 which is formed in the N type epitaxial layer 2 extending from the surface of the N type epitaxial layer 2 to the P type silicon semiconductor substrate 1 isolates each word line from adjacent word lines.

The surface of the epitaxial layer 2 including the memory cell is coated by an insulating layer 7 of, for example, silicon dioxide. A metal conductor bit line 8 of, for example, aluminum is connected to the N+ type region 4 forming a region of the diode DM through an aperture of the insulating layer 7. An N+ type contact region 9 is formed in the N type epitaxial layer 2 and a metal conductor word line 10 of, for example, aluminum is connected to the N+ type contact region 9 through an aperture of the insulating layer 7. The P type silicon semiconductor substrate 1 is connected to the most negative potential MNP. This substrate 1 corresponds to the current sink capacity circuit SC and plays the role of the collector output line $Z_1$ in FIG. 1A.

As a modification of the structure shown in FIGS. 3A, 3B and 3C, another structure of the memory device is illustrated in FIGS. 4A, 4B and 4C. In the memory of FIGS. 4A, 4B and 4C, the N+ type region 11 is formed on the surface of the N type epitaxial layer 2 in one side or both sides of the memory cell arrangement along the sequence of the memory cells. This N+ type region 11 can also be formed simultaneously with the formation of the N+ type region 4 or with the formation of the N+ type region 9. This N+ type region 11 plays a role in reducing the equivalent resistance of the N type epitaxial layer 2, which acts as a word line, along the longitudinal direction.

Another modification of the structure shown in FIGS. 3A, 3B and 3C, is illustrated in FIGS. 5A, 5B and 5C. In the memory device of FIGS. 5A, 5B and 5C, the N+ type region 12, which corresponds to the N+ type region 11 in FIGS. 4A, 4B and 4C, is formed on the border between the N type epitaxial layer 2 and the P type silicon semiconductor substrate 1. The N+ type region 12 has its width extending to the vicinity of each of the two side isolation regions 6 and has its length the same as the whole length of the word line formed by the N type epitaxial layer 2. However, no N+ type region is formed immediately beneath the memory cell. In accordance with this structure, the N+ type region 12 reduces the equivalent resistance of the N type epitaxial layer 2 along the direction of the word line. Also, since there is no N+ type region immediately beneath the memory cell, the greater portion $(1-1/\beta)$ of the current for writing-in the information passes effectively to the P type silicon substrate 1.

Another modification of the structure shown in FIGS. 3A, 3B and 3C, is illustrated in FIGS. 6A, 6B and 6C. In the memory device of FIGS. 6A, 6B and 6C, the N+ type region 13 which corresponds to the N+ type region 11 in FIGS. 4A, 4B and 4C, is formed on the border between the N type epitaxial layer 2 and the P type silicon semiconductor substrate 1. The N+ type region is formed between the memory cell region and the isolation region 6 and is as long as the whole length of the word line formed by the N type epitaxial layer 2. No N+ type region is formed immediately beneath the memory cell region. In accordance with this structure, the N+ type region 13 reduces the equivalent resistance of the N type epitaxial layer 2 along the direction of the word line. Also, since there is no N+ type region immediately beneath the memory cell, the greater portion $(1-1/\beta)$ of the current for writing-in the information passes effectively to the P type silicon substrate 1.

Another modification of the structure shown in FIGS. 3A, 3B and 3C, is illustrated in FIGS. 7A, 7B and 7C. In the memory device of FIGS. 7A, 7B and 7C, the P type layer 3' is formed on the N type epitaxial layer 2 by an epitaxial growth process. The isolation region 14 of insulating material is formed from the surface of said P type epitaxial layer 3' to a predetermined depth in the N type epitaxial layer 2 so that a plurality of the P type epitaxial layer 3' are separated like islands. The isolation region 6 of insulating material which separates the adjacent word lines is formed from the surface of the P type epitaxial layer 3' through the N type epitaxial layer 2 to the P type silicon semiconductor substrate 1. A plurality of the memory cells in one word line are separated by the isolation regions 14 of insulating material. The structure shown in FIGS. 7A, 7B and 7C is formed in accordance with the present invention so that the thickness and the impurity concentration of the P type epitaxial layer 3' are easily controllable and this structure is advantageous particularly for forming a junction having small depth.

As further modification of the structure shown in FIGS. 3A, 3B and 3C, a structure of the memory device is illustrated in FIG. 8. In the memory device shown in FIG. 8, a polycrystalline semiconductor layer 15 of, for example, polycrystalline silicon is formed between the N type region 4 and the bit line connecting conductor 8. In some cases the heat treatment is effected after the formation of the connecting conductor 8 in the process of producing the memory device. It is possible that the inter-metal compounds, which are produced by the reaction between the material of the connecting conductor and the semiconductor layer, can penetrate like a spike through the PN junction and break down the PN junction so that an undesirable information storing status is formed. The polycrystalline semiconductor layer 15 plays a role in preventing such an undesirable phenomena.

The structure of the memory device in which the memory circuit of FIG. 2 is formed is illustrated in FIGS. 9A, 9B and 9C. On the surface of the N type epitaxial layer 2 which is formed on the P type silicon semiconductor substrate 1 and is defined by the isolation region 6, a plurality of P type regions 3 are formed along the longitudinal direction. The N type epitaxial layer 2 constitutes the word line. The fuse 17, consisting of nichrome (Ni-Cr), polycrystalline silicon or the like, is located between the metal electrode 16, which is connected to the P type layer 3 and extends to the surface of the insulating layer 7 and the connecting conductor 8 for the bit line. The writing-in current passes from the connecting conductor 8 to the PNP type transistor. The heat generated by the writing-in current fuses the reduced width portion of the fuse 17. Thus, the writing-in of information is performed.

The isolation regions in the above described embodiments of the present invention are formed from the surface of the epitaxial layer to the P type silicon semiconductor substrate and define the word line region. The isolation region may be formed either by the well known structure resulting from impurity diffusion or by the well known V-groove structure. The V-groove structure is especially suitable for high integration of the memory device, because the V-groove structure needs only a small space. The above-mentioned isolation layer is formed simultaneously with the formation of the isolation layer in the control circuit of the memory cell, which is also formed in the memory device chip for the memory cell. With regard to the aforementioned N+ type region 12, 13, the N+ type region may be formed by means of the buried layer forming method for the bipolar integrated circuit.

With regard to the type of the transistor used in the memory cell, it is possible to use the NPN type transistors provided that the conduction types of the semiconductor substrate, the epitaxial layer and the like are opposite, respectively, to those in the above described embodiments. In this device, however, the control circuit for the memory cell formed in the epitaxial layer having an N type is formed by PNP type transistors. Since the operating speed of the control circuit is low, this device is disadvantageous for the realization of high speed operation. Also this device is disadvantageous, because a parasitic NPN type transistor consisting of the N type semiconductor substrate, the P type epitaxial layer and the N type region is formed when the PNP type transistor operates. This is because an N type semiconductor substrate having an becomes most positive, and wasted current passes from the N type semiconductor substrate to the PNP type transistor so that extra power is required.

It is also possible to form a structure in which the base of the NPN type transistor is used as a word line, a diode or a fuse is connected between the collector (or emitter) and bit line, and the emitter (or collector) is grounded. However, in this structure, a portion of the current, which passes to the word line of the writing-in current from the bit line and word line to the selected memory cell during the writing-in of the information, leaks from the base of the NPN type transistor of the memory cell which is not selected to the emitter, in the case where a diode or a fuse is connected between the collector and the bit line and the emitter is grounded. Accordingly, a greater ability is required for the circuit for the writing-in current connected to the word line. Therefore, it is necessary to connect both a circuit for the writing-in current and a circuit for controlling the reading-out of the information to the word line. However, this causes an increase in the number of semiconductor elements forming the circuit, and accordingly causes a reduction in the degree of integration and the operating speed of this semiconductor memory device. When a diode or a fuse is connected between the emitter of the NPN transistor and the bit line, it is necessary to maintain the collector at the most positive potential. This makes the structure of the control circuit for the memory cell complicated and causes a wasted current due to the parasitic transistor described above. In addition, the circuit for the writing-in current connected to the word line is different from the circuit for controlling the reading-out the information. Accordingly, this also causes an increase of the number of semiconductor elements forming the circuit and a reduction in the degree of integration and the operating speed of this semiconductor memory device.

Accordingly, it should be noted that these disadvantages do not occur in the aforementioned embodiments of the present invention.

What is claimed is:

1. A semiconductor memory device comprising:
    a plurality of bit lines;
    a plurality of word lines;
    a plurality of memory cells operatively connected to and located at a cross position of said plurality of bit lines and said plurality of word lines, wherein each of said memory cells comprises an information storing element having a first terminal and a PNP type transistor connected in series with said information storing element, wherein said PNP type transistor comprises a P type semiconductor substrate, having a surface, forming the collector region; an N type epitaxial layer, formed on the surface of said P type semiconductor substrate, forming the base region; and a P type region, formed in said N type epitaxial layer, forming the emitter region, wherein said first terminal of said information storing element is operatively connected to one of said plurality of bit lines, wherein the base region of said PNP type transistor is operatively connected to one of said plurality of word lines, and wherein the collectors of the PNP type transistor of each of said plurality of memory cells are operatively connected at a node.

2. A semiconductor memory device as set forth in claim 1, wherein said information storing element is a PN junction diode.

3. A semiconductor memory device as set forth in claim 1, wherein said information storing element is a fuse.

4. A semiconductor memory device having a plurality of PNP type transistors comprising:
    a P type semiconductor substrate having a surface;
    an N type epitaxial layer, having a surface, formed on the surface of said P type semiconductor substrate;
    a P type region formed on the surface of said N type epitaxial layer;
    an N+ type region formed in said P type region; and
    a connecting conductor layer connected to said N+ type region, wherein said connecting conductor layer is a bit line, wherein said N type epitaxial layer is a word line, and wherein said P type semiconductor substrate is a collector which is common to the plurality of PNP type transistors.

5. A semiconductor memory device comprising:
    a P type semiconductor substrate having a surface;
    an N type epitaxial layer, having a surface, formed on the surface of said P type semiconductor substrate;
    a P type region formed on the surface of said N type epitaxial layer; and
    a connecting conductor, forming a bit line;
    a fuse connected between said P type region and said connecting conductor, wherein said N type epitaxial layer is a word line and wherein said P type semiconductor substrate is a collector which is commmon to the plurality of PNP type transistors.

6. A semiconductor memory device having memory cells, comprising:
    a P type semiconductor substrate having a surface;
    an N type epitaxial layer former on the surface of said P type semiconductor substrate;
    a P type epitaxial layer, having a surface, formed on the surface of said N type epitaxial layer;
    a first isolation region, formed from the surface of said P type epitaxial layer to a predetermined depth in the N type epitaxial layer, for isolating the memory cells; and
    a second isolation region, formed from the surface of said P type epitaxial layer through said N type epitaxial layer to a predetermined depth in said P type semiconductor substrate, for defining a word line formed by said N type epitaxial layer.

7. A semiconductor memory device as set forth in claim 1, 4 or 5, wherein an N+ type layer is formed on the surface of said N type epitaxial layer along the direction of the sequence of the memory cells.

8. A semiconductor memory device as set forth in claim 1, 4, 5 or 6, wherein an N+ layer is formed on the border between the surface of said P type semiconductor substrate and said N type epitaxial layer along the direction of the sequence of the memory cells.

9. A semiconductor device as set forth in claim 1, wherein said information storing element is a PN junction diode.

10. A semiconductor device as set forth in claim 9, wherein said PN junction diode comprises said P type region and a diode N+ type layer formed in said P type region.

* * * * *

UNITED STATES PATENT AND TRADEMARK OFFICE
CERTIFICATE OF CORRECTION

PATENT NO. : 4,287,569
DATED : September 1, 1981
INVENTOR(S) : Fukushima

It is certified that error appears in the above—identified patent and that said Letters Patent is hereby corrected as shown below:

Front page, [73] Assignee, after "Limited," insert
-- Kawasaki, --;

[56] References Cited, "Chung" should be
-- Chung et al. --; "Daves" should be
-- Davis --; "Matsuda" should be
-- Matsuda et al. --;

[57] ABSTRACT, line 8, "the" should be -- a --.

Column 1, line 5, change "(1)." to -- (1) --;

line 10, change "(2)." to -- (2) Description of the --;

line 28, change "decorder" to -- decoder --.

Column 2, line 10, change "loated" to -- located --;

line 30, change "afore memtioned" to
-- aforementioned --;

line 35, change "reduce to" to -- reduce the --;

line 42, change "increasing" to -- increases --.

Column 3, line 20, after "and" insert -- a --;

line 26, change "memorzing" to -- memorizing --.

UNITED STATES PATENT AND TRADEMARK OFFICE
CERTIFICATE OF CORRECTION

PATENT NO. : 4,287,569
DATED : September 1, 1981
INVENTOR(S) : Fukushima

It is certified that error appears in the above—identified patent and that said Letters Patent is hereby corrected as shown below:

Column 5, lines 29, 48 and 66, change "3C," to -- 3C --.

Column 6, line 34, change "phenomena" to -- phenomenon --.

Column 7, line 16, delete "having an";

line 36, change "lihe" to -- line --;

line 49, after "reading-out" insert -- of --.

Column 8, line 45, change "commmon to the" to -- common to a --;

line 67, delete "1,".

Signed and Sealed this

Second Day of March 1982

[SEAL]

Attest:

GERALD J. MOSSINGHOFF

Attesting Officer     Commissioner of Patents and Trademarks